United States Patent [19]

Brown et al.

[11] Patent Number: 4,870,377
[45] Date of Patent: Sep. 26, 1989

[54] ELECTRONIC CIRCUIT SUBSTRATE CONSTRUCTION

[75] Inventors: Richard Brown, Berkeley Heights; Scott A. Bennett, Trenton; Virgil L. Lawson, Lakewood, all of N.J.

[73] Assignee: General Electric Company, Schenectady, N.Y.

[21] Appl. No.: 125,851

[22] Filed: Nov. 27, 1987

[51] Int. Cl.$^4$ .................... H01P 3/08; H05K 1/03
[52] U.S. Cl. .................... 333/238; 174/68.5; 357/80
[58] Field of Search .................... 333/238, 246, 247; 174/68.5; 357/80

[56] References Cited

U.S. PATENT DOCUMENTS

| | | | |
|---|---|---|---|
| 3,290,766 | 12/1966 | Cave | 29/830 X |
| 3,740,678 | 6/1973 | Hill | 333/238 |
| 3,828,229 | 8/1974 | Anazawa | 333/238 X |
| 3,999,142 | 12/1976 | Presser et al. | 357/80 X |
| 4,306,275 | 12/1981 | Miura | 174/68.5 X |
| 4,376,287 | 3/1983 | Sechi | 357/80 |
| 4,386,324 | 5/1983 | Schellenberg | 333/238 X |
| 4,520,561 | 6/1985 | Brown | 29/840 |
| 4,743,868 | 5/1988 | Katoh et al. | 333/246 X |

FOREIGN PATENT DOCUMENTS 2254803 6/1973 Fed. Rep. of Germany ..... 174/68.5
142803 6/1986 Japan .................... 333/246

OTHER PUBLICATIONS

Erwin F. Belohoubek, Adolph Presser & Harold S. Veloric, "Improved Circuit–Device Interface for Microwave Bipolar Power Transistors", IEEE Journal of Solid-State Circuits, vol. SC-11, No. 2, Apr. 1986, pp. 256-263.

Primary Examiner—Eugene R. LaRoche
Assistant Examiner—Benny T. Lee
Attorney, Agent, or Firm—William Squire; James C. Davis, Jr.; Paul R. Webb, II

[57] ABSTRACT

A microwave substrate is formed by thermocompression bonding a metalization system layer to two substrates having corresponding properties. One of the properties in one material is significantly different in value than that property in the other material. The substrates are selected from polycrystalline and monocrystalline ceramic materials. The bonded slabs are sliced and ground planes attached to form finished composite substrates.

9 Claims, 1 Drawing Sheet

ELECTRONIC CIRCUIT SUBSTRATE CONSTRUCTION

This invention relates to electronic circuit substrate fabrication and, more particularly, to electronic circuits that operate in microwave frequencies.

Background of the Invention

Hybrid microwave circuits frequently provide the means for matching a circuit to succeeding and following circuits as well as providing bias, filtering, splitting and combining functions for active devices. Devices are connected electrically by conductive paths left after selective etching away of a metalization layer deposited on a planar surface of electrically insulating substrate, typically a ceramic material. A side of the substrate opposite the components includes a metalization layer which serves as a ground plane for the circuit. Often the different components employed in a microwave circuit have different characteristics. For example, some components generate large amounts of heat and need to be coupled to heat sinks. Other components and the conductor paths at times require relatively small line widths of metalization and therefore require smooth substrate surfaces mandating the use of relatively dense substrate materials. Still other circuits need to have substrate dielectric constant values kept within a given range in order to meet a given set of circuit requirements.

Often the thermal, dielectric and density properties of the substrate materials are different for different materials. Therefore, selecting a given substrate material for a given circuit requires a compromise of the differing properties of different substrates to best meet the requirements of a given circuit. That is, for example, a substrate which exhibits low toxicity, is relatively inert, has high thermal conductivity and the proper dielectric constant, may not necessarily have the lowest loss. While a material may exhibit a high density relative to a generic composition, additives to the base material may adversely affect its electrical properties when compared to other materials. While it is true that the densest material within a specific material composition usually has the best properties, it may not be optimum for a specific application. Ideally, the substrate should maximize the performance of each component and each function.

Depending on a given set of circuit requirements for the different properties, a material is selected which best meets the circuit requirements. However, the substrate selected property values over the entire range of properties required of all components represents a compromise of different required properties and, therefore, may not always be satisfactory.

SUMMARY OF THE INVENTION

In accordance with one embodiment of the present invention, an electric circuit substrate construction comprises a first crystalline ceramic material adapted to receive an electronic circuit pattern on one surface thereof. The material has a first composition manifesting a first set of properties. A second crystalline ceramic material is adapted to receive an electronic circuit pattern on one surface thereof. The second material has a second composition different than the first composition and has a second set of properties which correspond to the first set. At least one property value of the second material is significantly different than the value of the corresponding property of the first material. A first metalized layer is secured to and between the first and second materials at respective facing edges thereof. Therefore components best suited to the first material or second materials are coupled thereto to maximize the utility of the material properties to the corresponding components.

DETAILED DESCRIPTION

Figure 1:
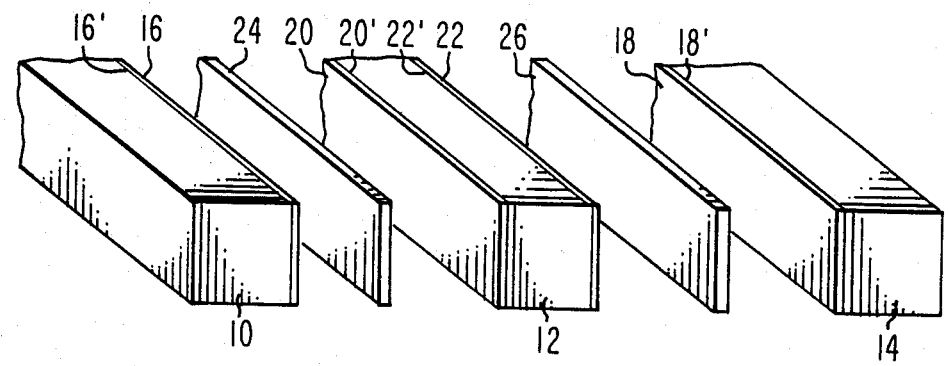
FIG. 1 is an isometric exploded view of an electronic circuit construction according to one embodiment of the present invention.

In FIG. 1, a plurality of slabs 10, 12 and 14 of substrate material are square section materials used in microwave circuitry. The slabs 10, 12 and 14 comprise material which are selected from a group comprising beryllia (beryllium oxide), alumina, sapphire, aluminum nitride, titanate composite materials and others as shown in Table I. The titanate composite materials include a wide variety of materials capable of withstanding an oxidizing atmosphere for processing the substrates. Such titanates may include barium titanate, barium nanotitanate, barium tetratitanate and a wide variety of other titanate compositions having similar characteristics. The beryllia, alumina and sapphire also can be processed at high temperatures in reducing atmospheres without detriment.

These different substrate materials each have different properties useful in a microwave circuit. Alumina, for example, is a ceramic that among other properties exhibits relatively low-loss, has low-toxicity, is inert, has relatively high thermal conductivity, and has a moderate dielectric constant, for example, an $\epsilon$ of about 10. Because it is relatively dense and has relatively low porosity, alumina has a surface which can accept metalized circuit pattern line widths of a certain minimum dimension. Further, its high density provides polished surfaces which are both flat and have few defects. This allows lines to be fabricated which are relatively smooth, are sharply defined and exhibit relatively low attenuation.

Line widths are important in microwave circuitry for producing components such as thin film capacitors and others. Aluminum oxide, in particular, is the densest of the substrate materials and has a surface which is most suitable of all of the substrate materials for microwave circuit construction.

A linewidth of a given circuit pattern in a microwave circuit also has certain relationships to the circuit electrical characteristics. For example, for a 50 $\Omega$ line, the linewidth takes advantage of the dielectric value of the alumina material. A low-frequency line may have a linewidth of 10 mils. However, a 50 $\Omega$ low frequency line on a titanate composition material of the same thickness may have a linewidth of 3 mils.

In most instances, a wider linewidth is more advantageous than a narrower one since wider lines are more easily processed and line defects have less of an effect on the circuit performance characteristics. However, wider lines exhibit greater shunt capacitance. For example, since microwave devices are frequently built in increments of one quarter wave length ($\lambda/4$ nodes) voltage, current and impedance distributions are a maximum. Lower frequency (longer wavelength) circuits are then, by nature, bigger. One way to reduce the circuit size is to increase the dielectric constant of the substrate, since the wave length is inversely proportional to the square root of the effective dielectric constant. Additionally, where slightly increased losses can be tolerated for short line lengths, as in the case of making capacitors on rutile ($\epsilon=80$), with other circuitry on alumina ($\epsilon=10$) with its lower loss. However, in other instances, components may require relatively narrow line widths. For example, coils in inductances and lines employed in capacitance at low frequencies may require relatively longer line lengths. A relatively high dielectric material permits shorter lines to be employed. Thus, characteristic impedance, signal frequency and component characteristics in many instances dictate the line widths and line lengths that need to be employed in a given implementation.

Other properties of the substrates may mandate primary consideration. For example, beryllia is often used because of its excellent high thermal conductivity. However, its dielectric value $\epsilon$ is 6.5. Therefore, relatively high heat dissipation components are employed with beryllia provided the relatively lower dielectric constant can be tolerated. While beryllia has the highest thermal conductivity, it is considerably lossier than alumina material. Also, beryllia is less dense than alumina and because of this its porosity results in greater surface roughness yielding lines with higher attenuation.

The porosity of the substrate surface is a factor in determining line thickness to overcome the substrate surface texture. The more porous surface acts as a bumpy surface to relatively thin lines and interferes with the line characteristics. For example, if lines are made sufficiently thin, openings due to porosity in the substrate surface may cause discontinuities in the line. Further, substrate porosity enhances retention of process chemicals affecting long term reliability. Therefore, materials such as in beryllia are less desirable than alumina.

The titanate ceramics have a dielectric constant significantly higher than that of the alumina materials and have useful dielectric constants $\epsilon$ ranging up to about 100 as compared to 10 for alumina. However, some titanate ceramics are considerably lossier than beryllia ceramics although some are no more lossy than alumina. Titanate ceramics have the advantage, however, in that they are capable of processing in an oxidizing atmosphere making them compatible with the alumina ceramics which can be processed in either reducing or oxidizing atmospheres. The atmosphere in which the materials can be processed has a bearing on the type of metalization deposited on the surface of the substrate material. Copper requires a reducing atmosphere, whereas gold may be used in an oxidizing atmosphere because gold is relatively inert in such an atmosphere. Also gold may be processed at a lower temperature.

Copper tends to oxidize in air forming a copper oxide and therefore is limiting with respect to the processing latitudes for the substrate material. Because gold is more inert in ambient atmosphere and does not oxidize, it permits a greater latitude in substrate processing. Therefore the titanate compositions are more suitable for use with god laminating and metalizing layers than other substrates requiring a reducing atmosphere. Aluminum nitride has a relatively high thermal conductivity, is a relatively new material for microwave substrate materials, is stronger than aluminum oxide and has a high thermal conductivity. The aluminum nitride tends to fracture less under stress than the aluminum oxide material. However, the aluminum nitride differs from aluminum oxide as follows. The nitride on aluminum nitride (AlN) surface is extremely stable and does not lend itself to reactions readily as aluminum oxide. Thus, adhesion of materials to AlN is more difficult. Aluminum nitride must be either etched to increase its surface roughness to enhance mechanical adhesion, or oxidized to increase the number of pendant oxygens available for reactions. Many AlN compositions presently contain sintering aids, such as Yttrium Oxide ($Y_2O_3$) which complicates processing. Aluminum oxide is 99.6 to 99.7% pure and is an excellent substrate material for thin film adhesion.

Other materials employed for substrates include a monocrystalline material, the above materials being polycrystalline. An example of a monocrystalline material is sapphire which has the properties as follows. Sapphire has an atomically smooth, defect free surface and well defined properties. However, as a single crystal, it is prone to thermal shock and its directional properties such as dielectric constant can contribute to anisotropy, an undesirable feature. In general, single crystal substrates are used only for monolithic or special applications. Table I lists some common polycrystalline microwave substrate materials and their various properties.

TABLE I

TYPICAL PROPERTIES OF SUBSTRATE MATERIALS

| | Density g/cm$^3$ | Temperature Coefficient of Expansion PPM/°C. | Thermal Conductivity W/cm/°K. | Dielectric Constant | Dielectric Loss | Flexural Strength Kpsi |
|---|---|---|---|---|---|---|
| Aluminum Oxide Al$_2$O$_3$ 96% | 3.75 | 7.1 | .26 | 9.5 | $4 \times 10^{-4}$ | 45 |
| Aluminum Oxide Al$_2$O$_3$ 99.6% | 3.9 | 6.5–7.3 | .37 | 9.9 | $1 \times 10^{-4}$ | 60 |
| Beryllium Oxide BeO 99.5% | 2.85 | 9.0 | 2.5 | 6.5 | $4 \times 10^{-4}$ | 33 |
| Aluminum Nitride AlN 98% | 3.26 | 4.2 | 1.4–1.7 | 10 | $20 \times 10^{-4}$ | 45 |
| Aluminum Nitride AlN 99.5% | 3.25 | 4.4 | 1.8 | 8.9 | $10 \times 10^{-4}$ | 63 |

TABLE I-continued

TYPICAL PROPERTIES OF SUBSTRATE MATERIALS

| | Density g/cm$^3$ | Temperature Coefficient of Expansion PPM/°C. | Thermal Conductivity W/cm/°K. | Dielectric Constant | Dielectric Loss | Flexural Strength Kpsi |
|---|---|---|---|---|---|---|
| Fosterite 2MgO SO$_2$ | 2.89 | 10 | .05 | 10 | $<2 \times 10^{-4}$ | 20 |
| Titanium Dioxide TiO$_2$ | 3.95 | 7.5 | .04 | 96 | $10 \times 10^{-4}$ | 20 |
| Nickel Aluminum Titanate | 3.95 | 9.0 | .04 | 31 | $<2 \times 10^{-4}$ | — |
| Magnesium Titanate | 3.5 | 7.5 | .04 | 15 | $<2 \times 10^{-4}$ | — |
| Barium Titanate BaTiO$_3$ | 4.35 | 7.5 | .04 | 38 | $<5 \times 10^{-4}$ | — |
| Barium Tetratitanate BaTi$_4$O$_9$Tio$_2$ | 4.4 | 9.2 | .02 | 50 | $<1 \times 10^{-4}$ | — |
| Magnesium Aluminum Titanate | 3.5 | 7.5 | .08 | 9.5-10.0 | $<1 \times 10^{-4}$ | 25 |
| Magnesia Spinel | 3.5 | 12 | .34 | 10 | $<1 \times 10^{-4}$ | 35 |

Density: In general the higher the density of a given type of material, e.g. alumina, the better the properties, lower loss, better surface, lower porosity.
Temp. Coeff of Expansion (TCE): For the most reliable laminates, the TCE should match, reducing stresses to a minimum. While gold is compliant, wide variations in TCE should be avoided.
Thermal Conductivity: The higher the value, the more heat can be extracted from the device, carrier or package.
Dielectric Constant: Determines linewidth for a given impedance at given substrate thickness and linelength for a given frequency. Both are inversely related to $\epsilon$.
Dielectric Loss: For high "Q"circuits, the dielectric loss should be as low as possible to minimize parasitics.
Flexural Strength: For handling and processing, higher strengths are important to prevent cracking.

Beryllium oxide being a rather porous mater makes it rather difficult to print on its surface an accurate circuit pattern. One solution to this problem is discussed in U.S. Pat. No. 4,376,287 to Franco Sechi assigned to the present assignee. Beryllium oxide is, furthermore, an abrasive and brittle material and potentially toxic, which makes it relatively difficult to process and to create certain substrate features. However, beryllium oxide is widely used for heat dissipation of active power devices which need good heat sinks. Since most microwave strip-type circuits use a number of different elements in the circuit system including power devices and printed components, a selection of any given substrate for a given circuit represents no more than a compromise of the desired characteristics for each specific component employed.

A solution to this problem is a substrate of the present invention. In FIG. 1, slab 10 may comprise a substrate of a first material, for example, alumina and slab 12 may comprise a substrate of a second material, for example, beryllia and slab 14 may be also be alumina or still a third material. From a practical point of view, differences in expansion coefficient will dictate somewhat how many materials are used. In the alternative, slabs 10 and 14 may be alumina and slab 12 may be a titanate composition. For example, with slabs 10 and 14, alumina has an $\epsilon=10$, barium titanate has an $\epsilon=33$ both types of slab have an expansion coefficient of $7.5 \times 10^{-6}$ ppm/°c, which permits gold bonding material to serve as a direct low inductance connection to ground. The relatively high dielectric material barium titanate permits distributive components to be reduced in size improving performance. Resonators may also be integrated into such a material substrate. The alumina is used for peripheral circuitry where wider line widths are mandated for electrical processing reasons. While in this example only three slabs are illustrated, two or more may be used according to a given implementation.

The edges 16', 20' and 22' and 18' of the respective slabs 10, 12 and 14 are metalized using any suitable method of metalization. For example, slab 10 has a metalization layer 16 on edge 16', slab 12 has metalization layers 20 and 22 on respective edges 20' and 22' and slab 14 has a metalization layer 18 on edge 18'. The metalized layers typically comprise a relatively thin chromium layer adhered to the slabs 10, 12 and 14 with a relatively thick (2.5-5.0 μm) layer of copper adhered to the chromium layer.

However, as pointed out above, copper is not suitable for an oxidizing atmosphere and in this case the layers 16, 18, 20 and 22 may comprise a 200-300 angstrom layer of titanium coated with a 1,000 angstrom layer of platinum. A layer of gold which may be about 1500 angstroms is then deposited over the platinum layer. A relatively thick gold layer 24 is then thermocompression bonded to the metalization layers 16 and 20 of substrates 10 and 12 and a similar gold layer 26 is thermocompression bonded to metalization layers 18 and 22. Layers 24 and 26 are preferably about 2 mils thick. The slabs 10, 12 and 14 and gold layers 24 and 26, FIG. 1, are bonded together to form a single composite substrate 28, FIG. 2. The thermocompression bonding is a typical well-known process. What is important is that the slabs 10, 12 and 14 be cubic to facilitate such bonding, i.e., the slabs have sufficient volume and dimension to withstand compression forces during bonding.

Figure 2:
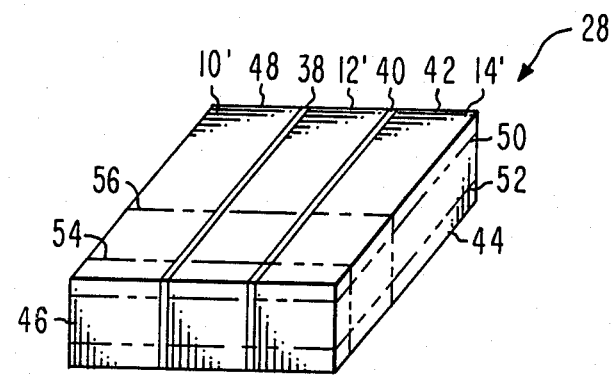
FIG. 2 is the assembly of the elements of FIG. 1 into a composite substrate structure.

In FIG. 2, substrate 28 comprises slabs 10', 12' and 14' compression bonded with metalization layers 38 and 40 employing the materials described, above in connection with FIG. 1. The primed reference numerals in FIG. 2 refer to the parts in FIG. 1 having the same unprimed reference numerals. Metalization layer 38 comprises the materials of layers 16, 20 and 24 of FIG. 1. Metalization layer 40 comprises the materials of layers 18, 22 and 26 of FIG. 1. The metalization layers 38 and 40 extend from upper surface 42 of the composite substrate to the lower opposite surface 44. Layers 38 and 40 are termed "septa" and provide an electrically conductive path between the surfaces 42 and 44.

The septa layers 38 and 40 also extend from edge 46 at one end of the substrate to edge 48 at the opposite end. A substrate formed with a septum is described in an article entitled "Improved Circuit-Device Interface for Microwave Bipolar Power Transistors" by Erwin F. Belohoubek et al. in the IEEE Journal of Solid-State Circuits, Vol. SC-11, No. 2, April 1976, pp. 256–263. In that article, the substrates are attached to a common septum shown in FIG. 3 thereof, and comprise beryllium oxide. U.S. Pat. No. 4,376,287 also describes an improved structure employing substrate materials on opposite sides of the septum comprising a beryllium oxide composition. In this context, the teachings of the above article and patent are representative of the widely-held belief by those of ordinary skill in the art that microwave strip-type circuits should be made of substrate material comprising the same composition throughout. The addition of a septum did not change that belief.

The next step after producing the composite substrate of FIG. 2 is to form the substrate slab into finished substrate pieces. Of course, it is possible to make finished substrate pieces from the initial thermocompression bonded substrates; but it is, as a matter of practical convenience, more efficient to form smaller substrates from a larger composite substrate as shown in FIG. 2.

In FIG. 2, the lines 50 and 52 represent slices through the substrates. Other cuts may be taken parallel to lines 50 and 52 to form any number of substrates in accordance with the size of the composite slab and the dimensions of the finished pieces. The composite substrate may then be diced at lines 54 and 56 and in other parallel cuts (not shown) to divide up the previously sliced pieces into further substrates. The dice lines 54 and 56 are perpendicular to the slice lines 50 and 52. The dice lines 54 and 56 form the finished substrates. The terms dices and slices are used only to distinguish the different sets of cuts and otherwise are intended to have no special meaning.

In accordance with a given implementation, the dice lines 54 and 56 may be omitted or the slice lines 50 and 52 may be omitted. In either case, the slice lines 50 and 52 and dice lines 54 and 56 are made through all of the substrates and septum metalization layers 38 and 40 to form a finished substrate comprising, in this example, three substrate materials bonded by two septa layers. The number of slices made depends on the thickness of the slabs typically about 2.5 cms. and the thickness of the finished substrate. A typical number of slices is 10–20, each 0.4 to 0.6 mils thick and the dices may be spaced any suitable distance apart depending on the size of the circuit to be placed on the substrate.

The number of dice lines parallel to lines 54 and 56 depends on the number of substrates and substrate size. A composite slab of FIG. 2 may yield about 40 to 150 diced and sliced substrates. After the slices parallel to lines 50 and 52 are made, but before the dices parallel to lines 54 and 56 are cut, the desired printed circuit conductive patterns are formed on the upper surface of what will be each finished substrate. The printed circuit pattern for each finished substrate is typically, though not necessarily, the same. One such circuit is illustrated in FIG. 3.

Figure 3:
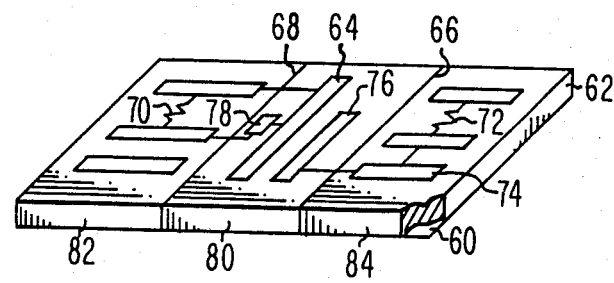
FIG. 3 is an isometric view of a completed substrate structure with microwave circuitry.

In FIG. 3, a conductive ground plane 60 is formed on the lower surface of each so-formed substrate. The ground plane 60 is a metalization layer formed by any conventional technique. Substrate 62 is shown broken away so that the ground plane 60 is visible. The ground plane 60 may be connected to portions of the circuit via the septa. For example, some conductor lines of the printed circuit pattern 64 typically will contact the septum 66. Other lines of pattern 64 will contact the septum 68. Other printed circuit conductor lines are kept away from the septa 66 and 68, examples being lines 70 and 72. Where is necessary, lines may be insulated from the septa in order to connect other circuitry that is not connected to ground.

Circuit elements connected between the various printed circuit lines may be printed onto the substrate or may be discrete components. Thus, a capacitor 74 may be coupled to a component 76. An active device such as an FET 78 pellet may be positioned on the central substrate 80. Other circuitry, such as couplers or other substrate materials may be employed in the embodiment of FIG. 3. It should be understood that the metalized conductive ground, plane 60 is in conductive contact with the septa metalization layers 66 and 68 for the entire length of layers 66 and 68.

The substrates 80, 82 and 84 are such materials that substrate 80 may differ from substrates 82 and 84 by the value of at least one property, for example, dielectric constant, thermal conductivity or one or more other properties. A component, such as the FET 78, which may be a high powered active device requiring high heat dissipation, may be mounted on a beryllia substrate 80. The circuit components on substrates 82 and 84 normally require relatively fine line widths and relatively non-porous material. These latter components may be on alumina ceramic material.

In the alternative, the substrates 82 and 84 may be a barium titanate material and the substrate 80 may be a beryllium material and the septa layers 66 and 68 may comprise gold layers as discussed above so that the entire substrate may be processed in an oxidizing atmosphere. For example, employing gold metalization septa, the processing temperature may be 400° C. as compared to 850° C. employing copper metalization septa. The finished substrate after slicing is lapped and polished so as to prepare the substrate for thin film deposition of the thin film circuitry formed on one surface of the composite substrate as shown in FIG. 3.

It is also possible that with advances in technology, thick film circuitry can be employed, replacing some or all of the thin film Many of these thick films require an oxidizing atmosphere, some, such as the non-noble (copper) base need a nitrogen environment. Therefore, it is intended that the present invention not be limited to oxidizing or reducing atmospheres, but may also employ inert atmospheres.

What is claimed is:

1. An electronic microwave circuit substrate construction comprising:
a first crystalline ceramic material having a first composition manifesting a first set of physical and electrical properties including flexural strength, density, thermal coefficient of expansion, thermal conductivity, dielectric constant and dielectric loss, each property having a given value for a given material;

a second crystalline ceramic material having a second composition different than the first composition and having a second set of properties corresponding to the first set, at least one property value of the second material being significantly different than the value of the corresponding property of the first material; and a first metalized layer secured to and between said first and second materials at respective facing edges thereof to form a composite structure, said composite structure having a first planar surface common to said first and second materials, said planar surface being adapted to receive a microwave electronic circuit pattern thereof.

2. The construction of claim 1 wherein said structure includes a second planar surface spaced from and parallel to the first planar surface, said construction further including a second metalized layer on said second planar surface and in contact with the first metalized layer.

3. The construction of claim 1 wherein said materials are selected from the group consisting of beryllium oxide, alumina, sapphire, aluminum nitride and a titanate composite material.

4. The construction of claim 1 wherein said metalized layer includes gold.

5. The construction of claim 1 including a third crystalline ceramic material and a second metalized layer secured to and between said third material and one of said first and second materials at respective facing edges thereof to form a composite structure therewith, said third material having a surface coplanar with said first planar surface, said first and second metalized edges being parallel, the third material having a set of physical and electrical properties corresponding to the properties of said first and second materials and having a composition different than at least one of said first and second compositions, at least one property of the third material being substantially different in value than the corresponding property of said at least one of said first and second compositions.

6. A microwave circuit construction comprising:

a first crystalline ceramic material of a first composition having a first property of a given value in a group of properties including flexural strength, density, thermal coefficient of expansion, thermal conductivity, dielectric constant and dielectric loss, each property having a given value for a given material;

a second crystalline ceramic material of a second composition having a second property corresponding to the first property of said group of properties, said second property being of a value substantially different than the first property value;

said materials each having first and second spaced parallel surfaces lying in a region defined by a plurality of edge surfaces;

a first metalized layer bonded to an edge surface of each said materials to bond said materials into a composite substrate whose first surfaces are parallel and whose second surfaces are parallel to each other and to said first surfaces, said layer extending to said first and second surfaces; and a second metalized layer bonded to one of said first and second spaced surfaces of said materials in electrical contact with said first metalized layer, the other of said first and second spaced surfaces being adapted for receiving a microwave circuit pattern.

7. The construction of claim 6 wherein said compositions are selected from the group consisting of beryllium oxide, alumina, sapphire, aluminum nitride and a titanate composition.

8. The construction of claim 6 further including a metalized circuit pattern on said other of said first and second surfaces.

9. The construction of claim 8 further including circuit components electrically coupled to said metalized circuit pattern.

* * * * *